(12) United States Patent
Kamiya et al.

(10) Patent No.: US 9,444,009 B2
(45) Date of Patent: Sep. 13, 2016

(54) GROUP-III NITRIDE COMPOUND SEMICONDUCTOR LIGHT EMITTING ELEMENT, MANUFACTURING METHOD THEREFOR AND SEMICONDUCTOR LIGHT EMITTING DEVICE

(71) Applicant: TOYODA GOSEI CO., LTD., Kiyosu-shi (JP)

(72) Inventors: Masao Kamiya, Kiyosu (JP); Koichi Goshonoo, Kiyosu (JP); Shingo Totani, Kiyosu (JP); Takashi Kawai, Kiyosu-shi (JP); Takahiro Mori, Kiyosu (JP); Koji Hirata, Kiyosu (JP)

(73) Assignee: TOYODA GOSEI CO., LTD., Kiyosu-shi, Aichi-ken (JP)

(*) Notice: Subject to any disclaimer, the term of this patent is extended or adjusted under 35 U.S.C. 154(b) by 0 days.

(21) Appl. No.: 14/028,379

(22) Filed: Sep. 16, 2013

(65) Prior Publication Data

US 2014/0077219 A1     Mar. 20, 2014

(30) Foreign Application Priority Data

Sep. 20, 2012  (JP) ................. 2012-207531
Jun. 4, 2013   (JP) ................. 2013-117784

(51) Int. Cl.
*H01L 21/02*  (2006.01)
*H01L 29/20*  (2006.01)
(Continued)

(52) U.S. Cl.
CPC ........... *H01L 33/32* (2013.01); *H01L 21/0237* (2013.01); *H01L 21/0243* (2013.01);
(Continued)

(58) Field of Classification Search
CPC ............ H01L 21/02458; H01L 21/0254; H01L 33/007; H01L 29/2003; H01L 33/32; H01L 33/28; H01L 33/285; H01L 33/0087; H01L 21/00; H01L 33/0037
USPC .................................... 257/76; 438/105, 931
See application file for complete search history.

(56) References Cited

U.S. PATENT DOCUMENTS

| | | |
|---|---|---|
| 5,780,873 A | 7/1998 | Itaya et al. |
| 6,335,546 B1 | 1/2002 | Tsuda et al. |

(Continued)

FOREIGN PATENT DOCUMENTS

| | | |
|---|---|---|
| JP | H09-129984 A | 5/1997 |
| JP | 2006-253670 A | 9/2006 |

(Continued)

OTHER PUBLICATIONS

Japanese Office Action dated Feb. 9, 2016 with an English translation.

*Primary Examiner* — John C Ingham
*Assistant Examiner* — Didarul Mazumder
(74) *Attorney, Agent, or Firm* — McGinn IP Law Group PLLC

(57) ABSTRACT

A group-III nitride compound semiconductor light emitting element includes a substrate that has a main face on which an concave and convex portion is formed, a group-III nitride compound semiconductor layer that is formed on the main face of the substrate, and a clearance that is formed between the substrate and the group-III nitride compound semiconductor layer at a first region of the semiconductor light emitting element. In the first region, a portion of the group-III nitride compound semiconductor layer and a portion of the clearance are disposed in a concave of the concave and convex portion on a section through two adjacent top portions of the concave and convex portion and a bottom portion located between the adjacent top portions.

16 Claims, 14 Drawing Sheets

(51) Int. Cl.
*H01L 33/32* (2010.01)
*H01L 33/00* (2010.01)
*H01L 33/20* (2010.01)

(52) U.S. Cl.
CPC ..... *H01L21/0254* (2013.01); *H01L 21/02458* (2013.01); *H01L 21/02664* (2013.01); *H01L 33/007* (2013.01); *H01L 33/20* (2013.01); *H01L 33/0079* (2013.01)

(56) References Cited

U.S. PATENT DOCUMENTS

| | | | |
|---|---|---|---|
| 2001/0050376 A1* | 12/2001 | Shibata | H01L 31/03042 257/190 |
| 2002/0014681 A1 | 2/2002 | Tsuda et al. | |
| 2006/0192247 A1 | 8/2006 | Urashima et al. | |
| 2006/0267025 A1* | 11/2006 | Wuu et al. | 257/79 |
| 2008/0131987 A1 | 6/2008 | Horino et al. | |
| 2008/0191226 A1 | 8/2008 | Urashima | |
| 2010/0102351 A1 | 4/2010 | Kim et al. | |
| 2010/0219439 A1 | 9/2010 | Kim | |
| 2011/0121334 A1* | 5/2011 | Dai et al. | 257/98 |
| 2011/0121348 A1 | 5/2011 | Dai et al. | |
| 2011/0215294 A1 | 9/2011 | Suzuki et al. | |
| 2012/0083063 A1* | 4/2012 | Shinoda et al. | 438/47 |
| 2012/0112188 A1* | 5/2012 | Yokoyama | 257/51 |
| 2012/0248459 A1* | 10/2012 | Sakano | 257/76 |
| 2013/0313597 A1 | 11/2013 | Dai et al. | |

FOREIGN PATENT DOCUMENTS

| | | |
|---|---|---|
| JP | 3987660 B2 | 10/2007 |
| JP | 2008-131000 A | 6/2008 |
| JP | 2008-131001 A | 6/2008 |
| JP | 2008-140918 A | 6/2008 |
| JP | 2009-38407 A | 2/2009 |
| JP | 2009-049179 A | 3/2009 |
| JP | 2011-114337 A | 6/2011 |
| JP | 2011-187616 A | 9/2011 |
| WO | WO 2009/002129 A2 | 12/2008 |

* cited by examiner

GROUP-III NITRIDE COMPOUND SEMICONDUCTOR LIGHT EMITTING ELEMENT, MANUFACTURING METHOD THEREFOR AND SEMICONDUCTOR LIGHT EMITTING DEVICE

CROSS-REFERENCE TO RELATED APPLICATIONS

This application claims the benefit of Japanese Patent Application Nos. 2013-117784 (filed on Jun. 4, 2013), and 2012-207531 (filed on Sep. 20, 2012), the entire contents of which are hereby incorporated by reference.

BACKGROUND

1. Technical Field

The present invention relates to a group-III nitride compound semiconductor light emitting element, a manufacturing method therefor and a semiconductor light emitting device. More specifically, the preset invention relates to a group-III nitride compound semiconductor light emitting element that is capable of improving light extraction efficiency, a manufacturing method therefor and a semiconductor light emitting device.

2. Related Art

The amount of light in a semiconductor light emitting element depends on the degree of emissions in an interior thereof and light extraction efficiency of light extracted to the outside from the semiconductor light emitting element. In a case where the light is directed from the semiconductor layer of large refractive index to the outside of small refractive index, light equal to or larger than a critical angle ($\theta c$) is totally reflected at an element interface (see, paragraph [0003] in JP-A-2009-38407). That is, light less than the critical angle ($\theta c$) is extracted to the outside from the semiconductor layer whereas light equal to or larger than the critical angle ($\theta c$) is not extracted to the outside from the semiconductor layer. For this reason, it is difficult to obtain a sufficient amount of light of the semiconductor light emitting element.

Therefore, in JP-A-2009-38407, the normal to the side surface of the semiconductor layer and the normal to the surface of the semiconductor layer are set to be greater than 90° but less than 180°, for example (see, paragraph [0013] in JP-A-2009-38407). That is, it is intended to increase the component of light that is less than a critical angle ($\theta c$) by changing an angle of the side surface of the semiconductor layer. As a result, it is expected that more light is easily transmitted to the outside from the side surface of the semiconductor layer (see, paragraph [0027] in JP-A-2009-38407).

In the case of JP-A-2009-38407, the amount of light extracted from the side surface of the semiconductor light emitting element is increased. However, the effect is limited. The reason is that light propagating to the side surface is limited to a portion thereof. Accordingly, in order to increase the amount of light to be extracted, it is desirable to extract the light that does not propagate to the side surface, from a place other than the side surface.

The present invention has bar made to solve the above-described problems of a prior art. That is, an object of the present invention is to provide a group-III nitride compound semiconductor light emitting element that is capable of improving light extraction efficiency of the light extracted from the on-axis direction, a manufacturing method therefor and a semiconductor light emitting device.

SUMMARY (1) According to an aspect of the invention, a group-III nitride compound semiconductor light emitting element includes a substrate that has a main face on which an concave and convex portion is formed, a group-III nitride compound semiconductor layer that is formed on the main face of the substrate, and a clearance that is formed between the substrate and the group-III nitride compound semiconductor layer at a first region of the semiconductor light emitting element. In the first region, a portion of the group-III nitride compound semiconductor layer and a portion of the clearance are disposed in a concave of the concave and convex portion on a section through two adjacent top portions of the concave and convex portion and a bottom portion located between the adjacent top portions.

In this group-III nitride compound semiconductor light emitting element, the light directed toward the substrate from the group-III nitride compound semiconductor layer is almost totally reflected at the interface between the semiconductor layer and an air layer (or resin layer region. Therefore, the light extraction efficiency of light to be extracted from a light extracting surface is high.

(2) In the group-III nitride compound semiconductor light emitting element of (1), in the first region, the group-III nitride compound semiconductor layer includes a convex portion that is convex toward the substrate. The convex portion is disposed at a position facing to a bottom portion of a concave of the concave and convex portion.

(3) In the group-III nitride compound semiconductor light emitting element of (2), a vertex of the convex portion of the group-III nitride compound semiconductor layer is disposed in the concave of the concave and convex portion on the section through the two adjacent top portions of the concave and convex portion and the bottom portion located between the adjacent top portions.

(4) The group-III nitride compound semiconductor light emitting element of (1) further includes voids that are formed in at least a portion between the substrate and the group-III nitride compound semiconductor layer at a second region of the semiconductor light emitting element.

(5) In the group-III nitride compound semiconductor light emitting element of (4), the clearance is formed between the substrate and the group-III nitride compound semiconductor layer at a third region of the semiconductor light emitting element, In the third region, a portion of the clearance is disposed in the concave of the concave and convex portion on the section through the two adjacent top portions of the concave and convex portion and the bottom portion located between the adjacent top portions.

(6) In the group-III nitride compound semiconductor light emitting element of (5), the first region is disposed between the second region and the third region.

(7) In the group-III nitride compound semiconductor light emitting element of (1), at least one hole penetrating the group-III nitride compound semiconductor layer and exposing the main surface of the substrate is formed on the group-III nitride compound semiconductor layer.

Accordingly, the formation region of the first region or the like is wide.

(8) In the group-III nitride compound semiconductor light emitting element of (1), the concave and convex portion of the substrate includes a slant surface that is in the range of 40° or more but 80° or less to the main surface of the substrate.

In the case of this range, the voids are easily formed.

(9) In the group-III nitride compound semiconductor light emitting element of (1), the group-III nitride compound semiconductor layer includes a buffer layer at a position facing the substrate, the buffer layer having an concave and convex shape along the concave and convex portion, and the buffer layer includes AlN.

(10) According to another aspect of the invention, a manufacturing method for a group-III nitride compound semiconductor light emitting element in which a group-III nitride compound semiconductor layer is formed on a substrate having a main surface on which an concave and convex portion is formed, includes forming the group-III nitride compound semiconductor layer on the concave and convex portion of the substrate, and wet-etching the group-III nitride compound semiconductor layer. In the forming process, a plurality of voids are formed between the concave and convex portion of the substrate and the group-III nitride compound semiconductor layer. In the wet-etching process, a clearance is formed between the substrate and a portion of the group-III nitride compound semiconductor layer by etching a portion of the group-III nitride compound semiconductor layer along the voids.

By performing an etching along the voids, the clearance can be properly formed between the substrate and the group-III nitride compound semiconductor layer.

(11) In the manufacturing method for the group-III nitride compound semiconductor light emitting element of (10), in the wet-etching process, voids located between the substrate and remaining portion of the group-III nitride compound semiconductor layer are left to be remained.

(12) In the manufacturing method for the group-III nitride compound semiconductor light emitting element of (11), the forming process includes forming a buffer layer made of AlN on the concave and convex portion of the substrate, and forming a layer made of a group-III nitride compound semiconductor on the buffer layer. In the buffer layer forming process, the voids are formed on the buffer layer.

(13) In the manufacturing method for the group-III nitride compound semiconductor light emitting element of (12), in the wet-etching process, the buffer layer and the layer made of the group-III nitride compound semiconductor are etched using phosphoric acid solvent as etching solution.

(14) According to another aspect of the invention, a semiconductor light emitting device includes the group-III nitride compound semiconductor light emitting element described in claim 1, a case that accommodates the group-III nitride compound semiconductor light emitting element in the concave portion, and a sealing resin that fills the concave portion.

In this semiconductor light emitting device, the brightness is bright.

(15) In the semiconductor light emitting device of (14), the sealing resin fills the clearance.

Even in this case, it does not change the fact that the light is reflected at an interface between the semiconductor layer and the sealing resin.

According to the present invention, it is possible to provide a group-III nitride compound semiconductor light emitting element that is capable of improving light extraction efficiency of the light extracted from the on-axis direction, a manufacturing method therefor and a semiconductor light emitting device.

DETAILED DESCRIPTION

Hereinafter, specific embodiments of a semiconductor light emitting element will be described illustratively with reference to the accompanying drawings. However, the present invention is not limited to these embodiments. Further, an electrode structure and stacked structure of each layer of the semiconductor light emitting element to be described later are merely examples. It is natural that a stacked structure different from the illustrative embodiments may be used. The thickness of each layer in respective drawings does not represent an actual thickness but is shown conceptually. In addition, the shape of concave and convex in respective drawings is drawn to make it easy to understand. However, actually, the shape of concave and convex is a very fine shape.

(First Embodiment)

Figure 1:
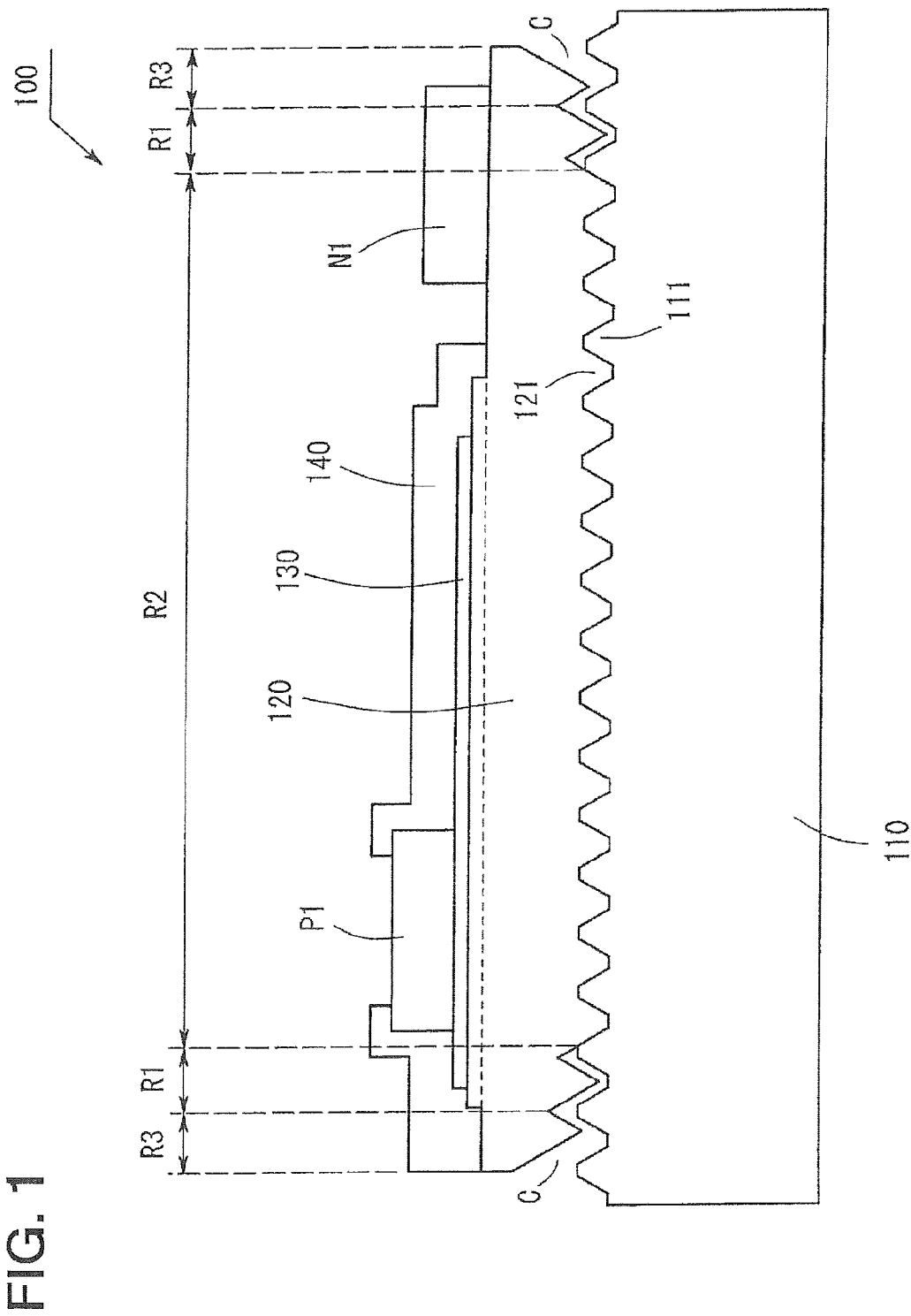
FIG. 1 is a view showing a configuration of a group-III nitride compound semiconductor light emitting element according to the first embodiment.

1. Semiconductor Light Emitting Element 1-1. Configuration of Light Emitting Element FIG. 1 shows a sectional view of a light emitting element 100 of the present embodiment. The light emitting element 100 is a group-III nitride compound semiconductor light emitting element including a group-III nitride compound semiconductor layer. As shown in FIG. 1, the light emitting element 100 includes a substrate 110, a semiconductor layer 120, a conductive transparent film 130, an insulation film 140, an n-pad electrode N1 and a p-pad electrode P1.

The substrate 110 is a sapphire substrate. Further, a Si substrate, a SiC substrate or a ZnO substrate may be used. In addition, a GaN substrate may be used. A concave and convex portion 111 is formed on a main surface (surface) of the substrate 110. The concave and convex portion 111 is a place on which the semiconductor layer 120 is formed.

The semiconductor layer 120 is a layer including a group-III nitride compound semiconductor. The semiconductor layer 120 includes a buffer layer, an n-type contact layer, an n-type ESD layer, an n-type super-lattice layer, a light emitting layer, a p-type cladding layer and a p-type contact layer, which are formed in order from the substrate 110 side, for example. These layers are merely examples and layers other than these layers may be employed. Further, as the material of the above-described layers, AlGaN, InGaN or AlInGaN or the like may be used, in addition to GaN such as n-type GaN or p-type GaN.

Here, the buffer layer is formed in a concave and convex shape along concave and convex of the concave and convex portion 111 at a position located on the substrate 110 and facing the substrate 110. Then, the group-III nitride compound semiconductor such as the n-type contact layer is formed on the irregular-shaped buffer layer. For this reason, the group-III nitride compound semiconductor is formed along the concave and convex of the concave and convex portion 111. As the material of the buffer layer, AlN or GaN may be used, for example. In a case where the buffer layer is made of AlN, the semiconductor layer 120 includes AlN that is an insulator.

The conductive transparent film 130 is intended to obtain an ohmic contact and the p-type contact layer of the semiconductor layer 120. As the material of the conductive transparent film 130, ITO, ICO, IZO, ZnO, $TiO_2$, $NbTiO_2$, $TaTiO_2$ or the like may be used, for example. Of course, the material other than these materials may be used. The insulation film 140 is intended to protect the surface of the semiconductor layer 120 or the like.

The n-pad electrode N1 is a pad electrode which is brought into contact with the n-type contact layer of the semiconductor layer 120. The p-pad electrode P1 is a pad electrode which is provided on the conductive transparent film 130. These electrodes are electrically connected to an external power source by wire bonding or the like.

1-2. Region of Semiconductor Light Emitting Element

Further, as shown in FIG. 1, the light emitting element 100 includes a first region R1, a second region R2 and a third region R3. Each of these regions R1, R2, R3 is a region having the semiconductor layer 120. The first region R1 is arranged at a position between the second region R2 and the third region R3. The first region R1 and the third region R3 are formed with a clearance C over these regions. The clearance C is formed between the substrate 110 and the semiconductor layer 120. Details of the clearance C will be described later in detail. In the second region R2, a plurality of voids are formed between the substrate 110 and the semiconductor layer 120. Similarly, the voids will be described later.

2. Shape of Substrate

Figure 2:
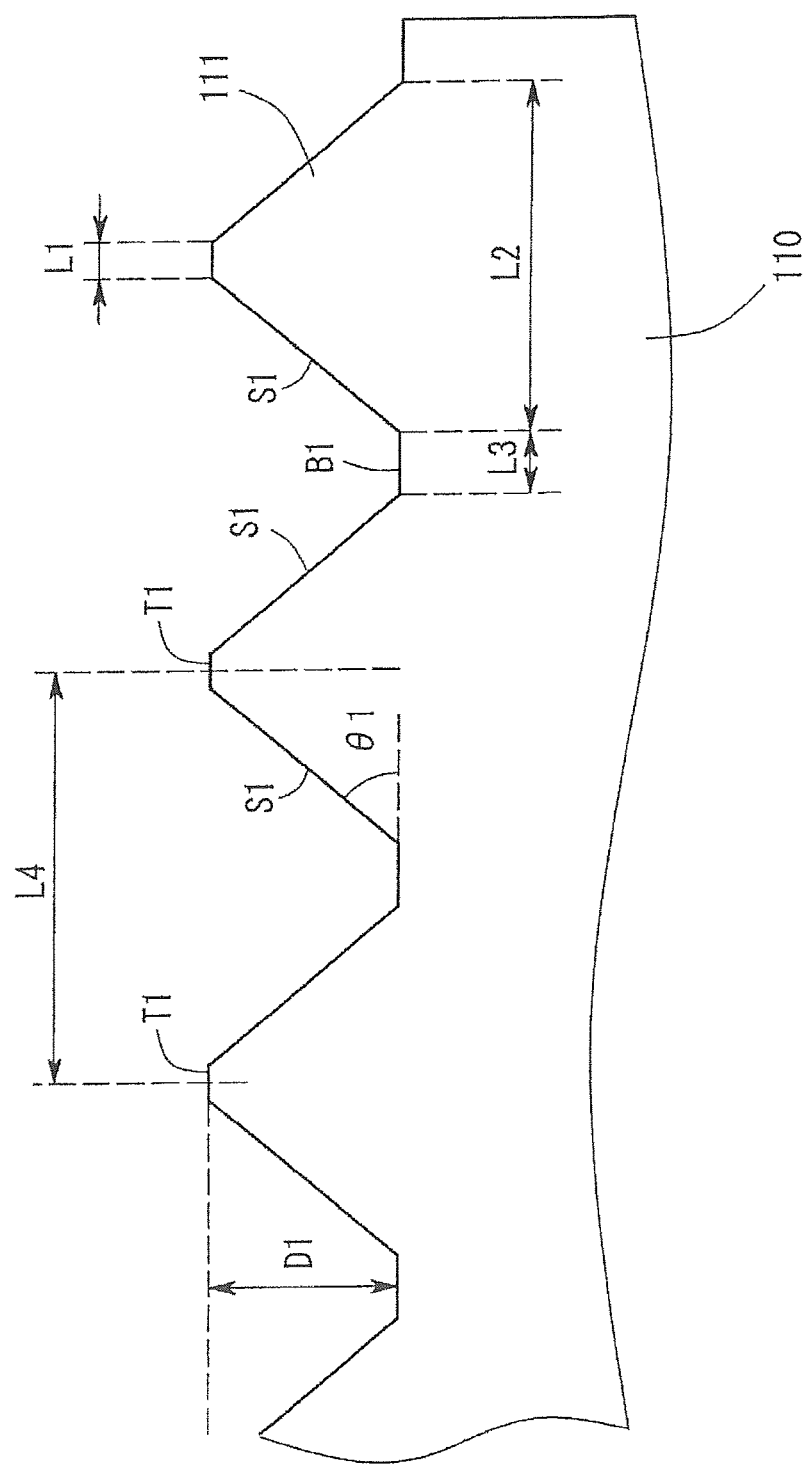
FIG. 2 is a sectional view for explaining the shape of a substrate of the group-III nitride compound semiconductor light emitting element according to the first embodiment.

Now, the concave and convex portion 111 of the substrate 110 is described. As shown in FIG. 2, the concave and convex portion 111 is formed at a main surface of the substrate 110 on which the semiconductor layer 120 is formed. The concave and convex portion 111 includes bottom surfaces B1, slant surfaces S1 and top portions T1. The bottom surface B1 is provided between the top portion T1 and the adjacent top portion T1. A periodic concave and convex shape is formed by repetition of these structures.

Here, a width L1 of the top portion T1 is in the range of 0 μm or more but 2 μm or less. A width L2 of a root portion is in the range of 0.1 μm or more but 5 μm or less. A width L3 of the bottom surface B1 is in the range of 0 μm or more but 2 μm or less. As will be described later, since it is difficult to form the voids in the bottom surface B, it is desirable that the width L3 is smaller. A pitch L4 of the top portion T1 is in the range of 1 μm or more but 10 μm or less. A depth D1 of the concave and convex portion 111 is in the range of 0.5 μm or more but 5 μm or less. Here, the depth D1 of the concave and convex portion 111 refers to a distance between the bottom surface B1 and the top portion T1. The voids are easily formed when an angle θ1 of the slant surface S1 to the main surface is in the range of 40° or more but 80° or less. These values are examples of a condition in which the voids are easily formed. As will be described later, the condition in which the voids are easily formed is changed depending on other factors as well as conditions of the concave and convex portion 111 of the substrate 110. Accordingly, as these numerical values, values other than the above-described values may be used.

Figure 3:
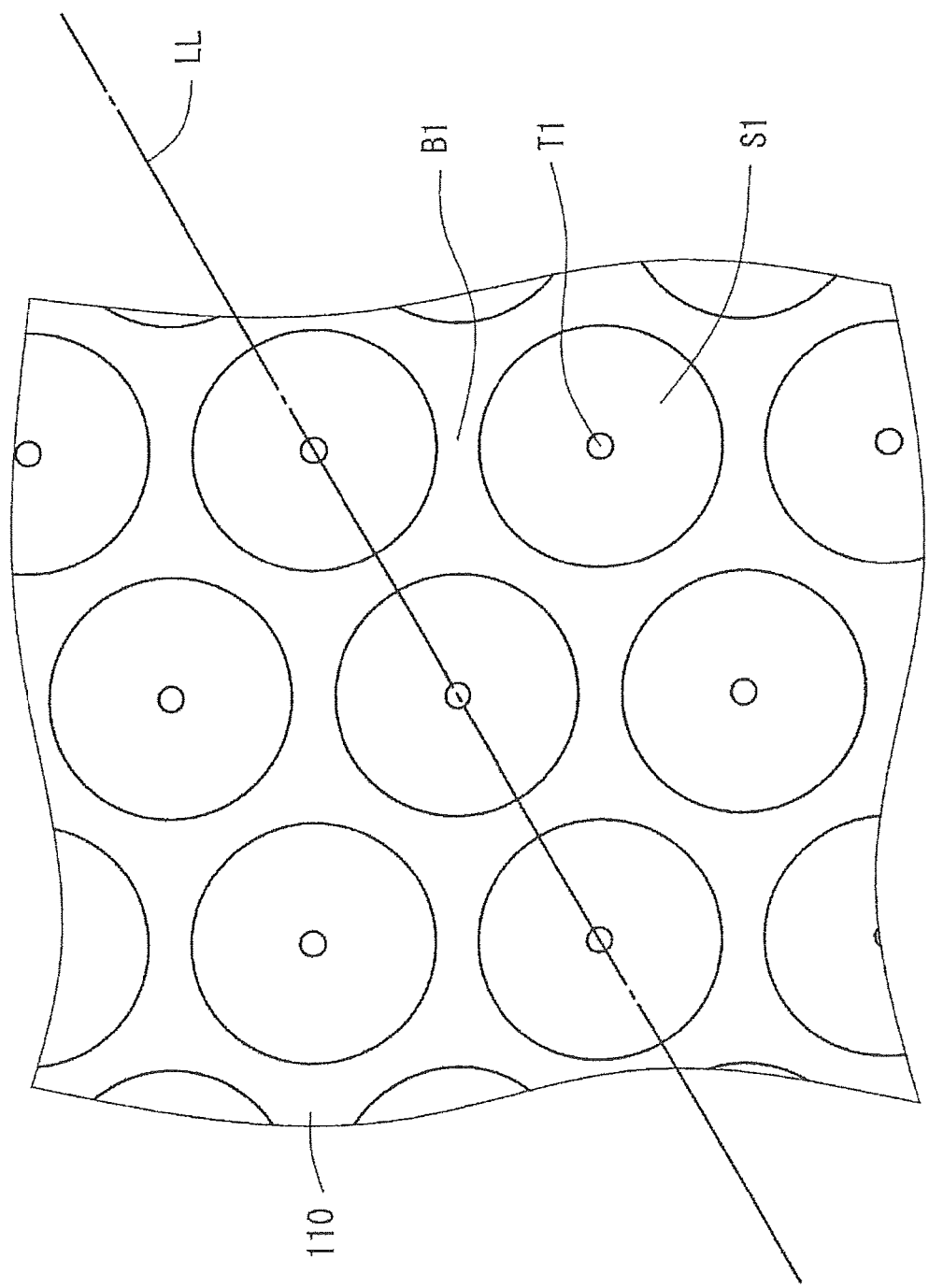
FIG. 3 is a plan view for explaining the shape of a substrate of the group-III nitride compound semiconductor light emitting element according to the first embodiment.

FIG. 3 shows a plan view of the substrate 110 as seen from the main surface. As shown in FIG. 3, the convex shape of the concave and convex portion 111 is a truncated cone shape. Here, the top portion T1 of the truncated cone is flattened. The convex shapes are arranged in a honeycomb shape. That is, the convex shapes are arranged at positions of each vertex of the regular hexagon and a center position of the regular hexagon. The top portion T1 is circular. Further, the top portions T1 are arranged discretely like islands. The bottom surface B1 is a surface parallel to the main surface of the substrate 110. Further, the bottom surface B1 is a surface that is continuous.

Figure 4:
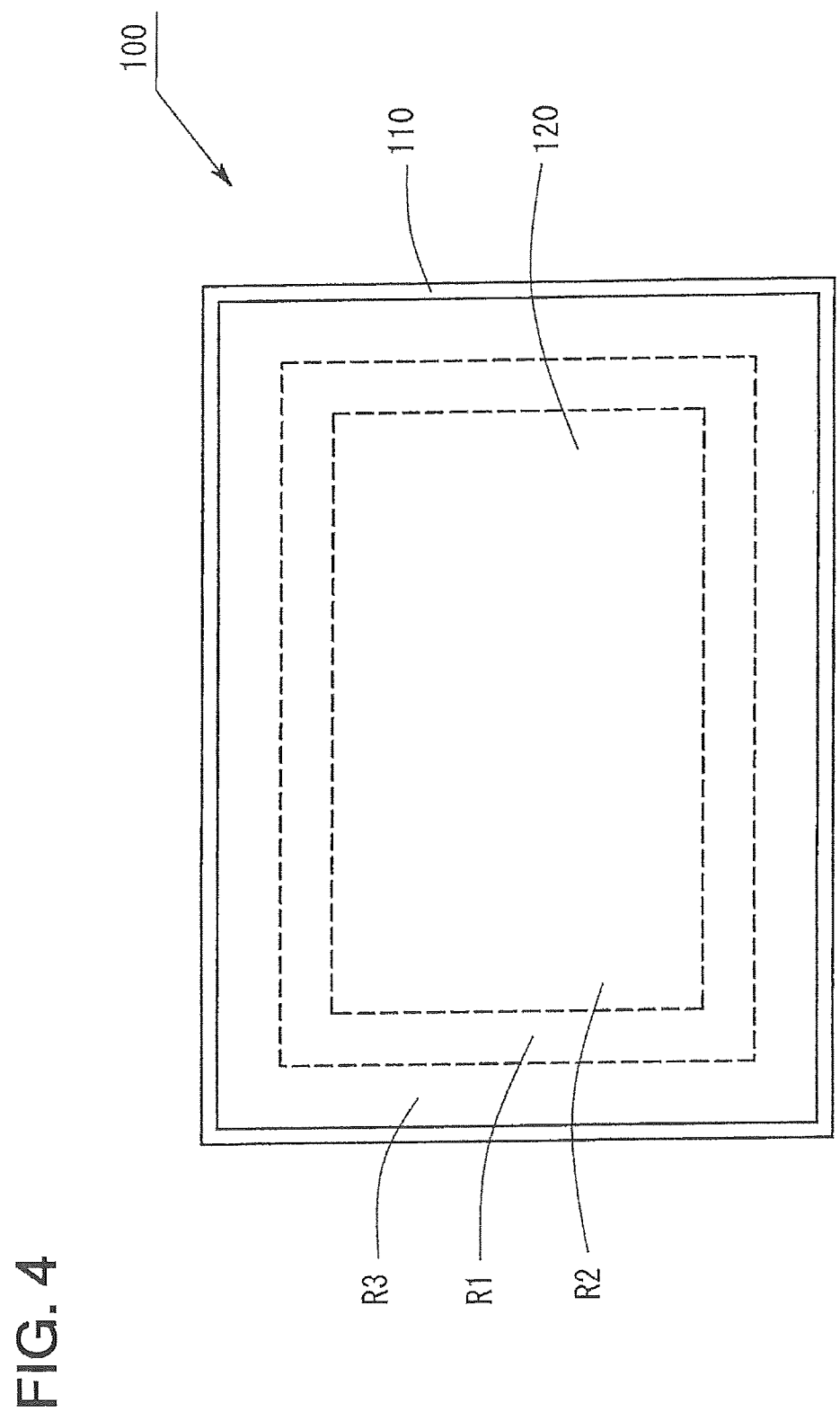
FIG. 4 is a view showing a first region, second region and third region of the group-III nitride compound semiconductor light emitting element according to the first embodiment.

3. State of Interface between Substrate and Semiconductor Layer 3-1. First Region, Second Region and Third Region As shown in FIG. 4, the light emitting element 100 includes the first region R1, the second region R2 and the third region R3. A region with the clearance C is defined as the first region R1 and the third region R3. On the contrary, a region without the clearance C is defined as the second region R2. Difference between the first region R1 and the third region R3 is described later.

3-2. Clearance

As described above, the light emitting element 100 is characterized by including the clearance C in the first region R1 and the third region R3, as shown in FIG. 1 and FIG. 4. The clearance C is formed between the substrate 110 and the semiconductor layer 120. Further, the clearance C is not present in the second region R2.

Figure 5:
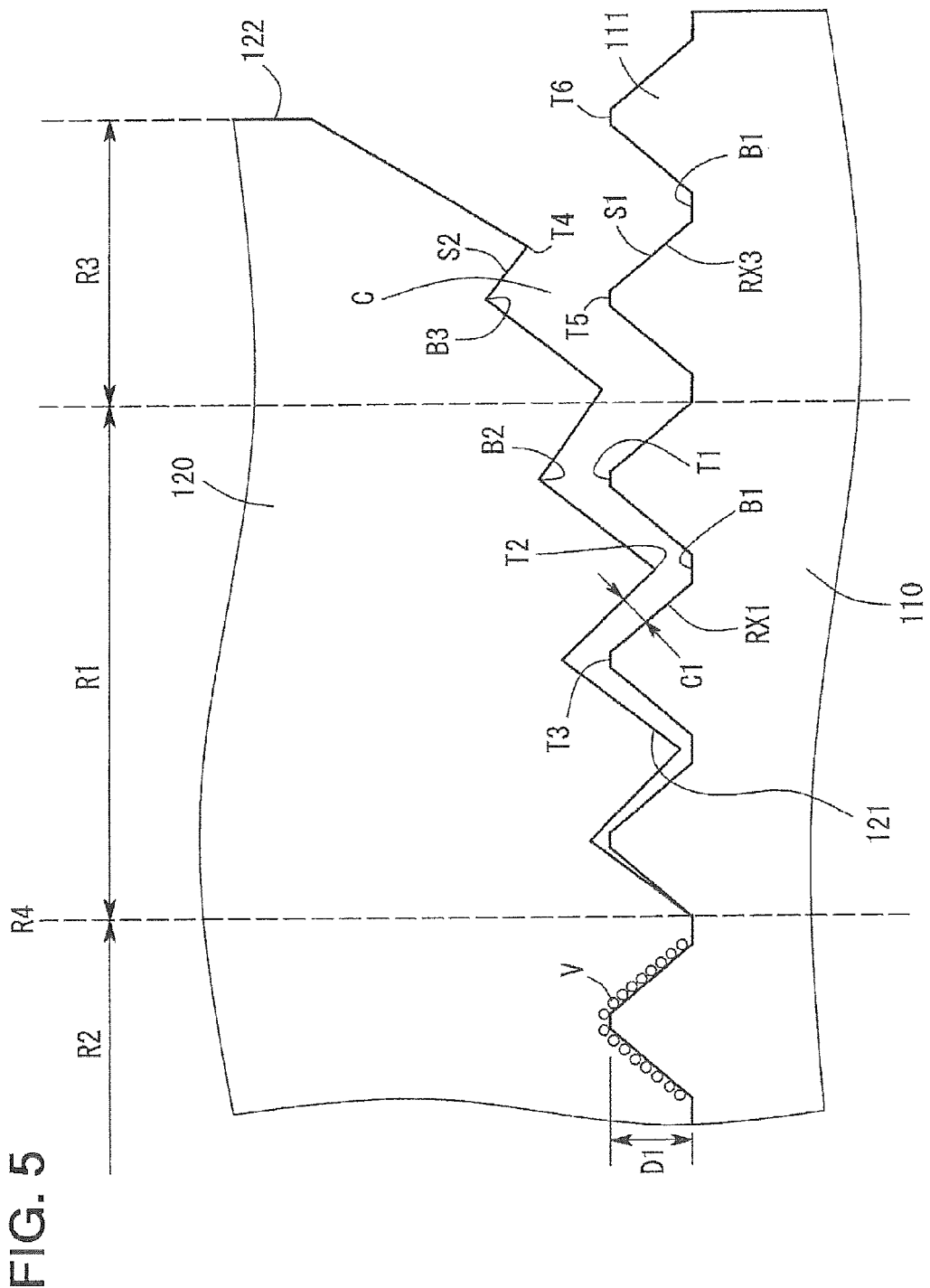
FIG. 5 is a view for explaining the shape of a clearance of the group-III nitride compound semiconductor light emitting element according to the first embodiment.

The shape of the clearance C is shown in FIG. 5. FIG. 5 is a sectional view showing a section corresponding to the section at a line LL of FIG. 3. The section at the line LL represents a section through adjacent top portions T1 and the bottom surface B1 located between the adjacent top portions T1. The clearance C is formed by performing a wet etching process, as will be described later. Accordingly, the clearance C is formed at a place where etching solution flows between the semiconductor layer 120 and the substrate 110. Further, as will be described later, the etching proceeds along the shape of the concave and convex portion 111 of the substrate 110. Further, the etching proceeds to connect the voids formed on the concave and convex portion 111 of the substrate 110. For this reason, a width C1 of the clearance C, that is, a width between the substrate 110 and the semiconductor layer 120 is gradually narrowed farther away from an end 122 of the semiconductor layer 120.

3-3. Clearance (First Region)

In the first region R1, the shape of concave and convex 121 of the semiconductor layer 120 is a shape corresponding to the concave and convex portion 111 of the substrate 110, that is, a shape that is obtained by inverting the concave and convex portion 111 of the substrate 110. The concave and convex 121 include a convex portion (top portion T2) which is convex toward the substrate 11 side and a concave portion (bottom portion B2) which is concave toward the substrate 11 side. Further, the top portion T1 of the substrate 110 and the bottom portion B2 of the semiconductor layer 120 are opposed to each other via the clearance C. The bottom surface B1 of the substrate 110 and the top portion T2 of the semiconductor layer 120 are opposed to each other via the clearance C. That is, the top portion T1 and the bottom portion B2 are disposed to be opposed to each other. The bottom surface B1 and the top portion T2 are disposed to be opposed to each other.

A concave portion RX1 is shown in FIG. 5. The concave portion RX1 is a concave portion at a section through the top portion T1 and top portion T3 of the concave and convex portion 111 to be adjacent and the bottom surface B1 located between these top portions. The concave portion RX1 is located on the first region R1. A portion of the clearance C and a portion of the semiconductor layer 120 are disposed in an interior of the concave portion RX1, i.e., in the range indicated by a depth D1 in FIG. 5. Accordingly, the top portion T2 of the semiconductor layer 120 is disposed in the interior of the concave portion RX1. That is, the top portion T2 of the semiconductor layer 120 is positioned between the top portion T1 and bottom surface B1 of the substrate 110.

3-4. Clearance (Third Region)

As shown in FIG. 5, similarly to the first region R1, the clearance C is formed in the third region R3. The clearance C is formed over the first region R1 and the third region R3. Also in the third region R3, a top portion T4 of the semiconductor layer 120 and the bottom surface B1 of the substrate 110 are disposed to be opposed to each other. Further, a bottom portion B3 of the semiconductor layer 120 and a top portion T5 of the substrate 110 are disposed to be opposed to each other.

A concave portion RX3 is shown in FIG. 5. The concave portion RX3 is a concave portion at a section through the top portion T5 and top portion T6 of the concave and convex portion 111 to be adjacent and the bottom surface B1 located between these top portions. The concave portion RX3 is located on the third region R3. A portion of the clearance C is disposed in an interior of the concave portion RX3 but the semiconductor layer 120 is not disposed in the interior of the concave portion RX3. That is, the top portion T4 of the semiconductor layer 120 is not positioned in the interior of the concave portion RX3. At this point, the third region R3 is different from the first region R1.

3-5. Effects of Clearance

In this way, the clearance C is formed over the first region R1 and the third region R3. Typically, air enters the clearance C. The refractive index of air is 1.0. Further, the refractive index of GaN is 2.4. Accordingly, most of the light is totally reflected at the boundary between the clearance C and the semiconductor layer 120 of the light emitting element 100. For this reason, there is little risk that the light leaks to the outside from the side surface of the light emitting element 100. Further, the light reflected at the interface between the semiconductor layer 120 and the clearance C is extracted from the on-axis direction.

3-6. Voids (Second Region)

FIG. 5 shows a sectional view of the second region R2 of the light emitting element 100. As shown in FIG. 5, in the second region R2, a number of voids V are generated on the concave and convex portion 111 of the substrate 110. The voids V are formed on the top portion T1 and slant surface S1 of the concave and convex portion 111. That is, the voids V are generated in the buffer layer of the semiconductor layer 120. And so, in the second region R2, the voids V remains between the substrate 110 and the semiconductor layer 120. In FIG. 5, the voids are not generated in the bottom surface B1 of the concave and convex portion 111.

A boundary surface R4 (shown in FIG. 5) between the first region R1 and the second region R2 is positioned in the range of 5 μm or more but 50 μm or less from an end 122 of the semiconductor layer 120. The position of the boundary surface depends on the etching time, in addition to the etching solution or etching rate. Further, the position of the boundary surface also depends on the degree of generation of the voids V.

3-7. Arrangement Position of Region

As shown in FIG. 5, the third region R3, the first region R1 and the second region R2 are positioned in order from the end surface 122 of the semiconductor layer 120.

4. Manufacturing Method for Group-III Nitride Compound Semiconductor Light Emitting Element According to the present embodiment, in a semiconductor layer forming process, the semiconductor layer 120 is formed while generating the voids V in the concave and convex portion 111 of the substrate 110 so as to form the clearance C by etching. And then, an etching process for executing an etching processing to connect the voids V is performed.

4-1. Semiconductor Layer Forming Process (Void Forming Process)

Figure 6:
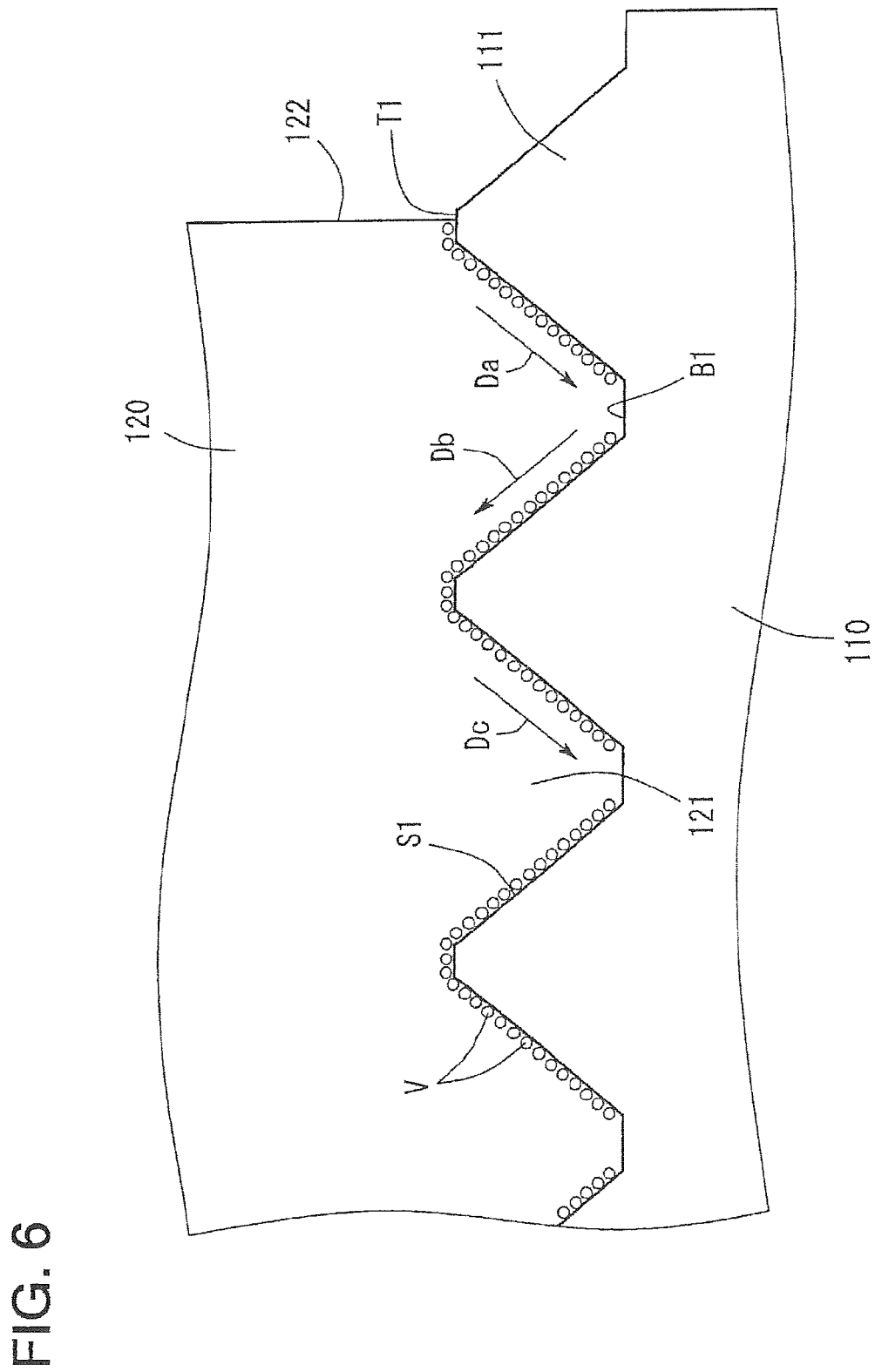
FIG. 6 is a view showing a state after a semiconductor layer forming process in a manufacturing method for the group-III nitride compound semiconductor light emitting element according to the first embodiment.

First, as shown in FIG. 6, the semiconductor layer 120 is formed on the substrate 110 including the concave and convex portion 111. For this purpose, the metal-organic chemical vapor deposition (MOCVD) may be used. A buffer layer, an n-type contact layer, an n-type ESD layer, an n-type super-lattice layer, a light emitting layer, a p-type cladding layer and a p-type contact layer are formed in this order from the substrate 110 side. These layers are merely examples and other stacked structure other than this structure may be employed.

Upon forming the semiconductor layer 120, as shown in FIG. 6, a number of voids V are formed between the concave and convex portion 111 of the substrate 110 and the concave and convex 121 of the semiconductor layer 120. Accordingly, the semiconductor layer 120 is formed on the concave and convex portion 111 in a state where a number of voids V are provided on the concave and convex portion 111 of the substrate 110. As shown in FIG. 6, the voids are not formed in the bottom surface B1 of the substrate 110.

Whether or not the voids V are generated is changed depending on various conditions. For example, this depends on the concave and convex portion 111 of the substrate 110, growth rate of the semiconductor layer 120 or the thickness of the buffer layer or the like. As a condition of the concave and convex portion 111, a distance between the top portions T1, an angle of the slant surface S1 or a width of the bottom surface B1 may be included.

4-2. Electrode Forming Process

Then, the conductive transparent film 130 is formed on the p-type contact layer of the semiconductor layer 120. Next, a portion of the p-type contact layer is exposed. Then, the n-pad electrode N1 is formed on the n-type contact layer and the p-pad electrode P1 is formed on the conductive transparent film 130 (see FIG. 1). Subsequently, a passivation film 140 is formed so as to expose a portion of the p-pad electrode P1.

4-3. Dry Etching Process

Next, a dry etching is performed after forming the electrode. For example, ICP using $Cl_2$ is performed. As a result, a portion of the semiconductor layer 120 is scooped out, so that the semiconductor layer 120 is partitioned into the size of the light emitting element 100. That is, the end 122 of the semiconductor layer 120 is exposed.

In a wet etching process to be described later, etching solution enters through a place exposed by the dry etching. As the etching solution enters therethrough, the clearance C is formed. On the contrary, it is possible to prevent the wet etching from a place by setting the place which is not exposed by the dry etching.

4-4. Wet Etching Process

Subsequently, the wet etching process is performed on a wafer having the voids V and the semiconductor layer 120 formed thereon. Processing liquid is phosphate, for example. Of course, other processing liquid may be used. By doing so, the semiconductor layer 120 can be subjected to the wet etching. Specifically, the etching proceeds, as indicated by an arrow Da in FIG. 6. The etching proceeds along the concave and convex of the concave and convex portion 111 of the substrate 110, as indicated by arrows Db, Dc in FIG. 6. The reason is that the etching proceeds along the voids V so as to connect the voids V. That is, since the voids V are present, the etching rate in a direction along the concave and convex portion 111 of the substrate 110 is faster than the etching rate in the other directions.

In this wet etching, the substrate 110 is not etched, but the semiconductor layer 120 is etched. As a result, the clearance C is formed the first region R1 and the third region R3. On the other hand, the voids V still remain in the second region R2 where the etching solution does not reach.

4-5. Element Separating Process

Subsequently, a number of elements formed on the wafer are separated. In this case, a laser or breaking is used. Further, a dicing may be used. In this way, the light emitting element 100 is manufactured.

Further, other subsequent process may be performed. In addition to the above process, a heat treating process may be properly performed. Also, in a case where the wet etching process is performed after carrying out the semiconductor layer forming process, other process order may be employed.

5. Modification

5-1. Void

In FIG. 5 or FIG. 6, the voids V are drawn as being not formed on the bottom surface B1 of the concave and convex portion 111 of the substrate 110. However, whether or not the voids V are generated also depends on the other conditions. Accordingly, the voids V may be generated in the bottom surface B1. In this case, the voids are formed over the entire surface between the substrate 110 and the semiconductor layer 120.

5-2. Concave and convex portion of Substrate

In FIG. 2, etc., it was considered that the bottom surface B1 is provided in the substrate 110. The width of the bottom surface B1 may be reduced. Further, the width L3 of the bottom may be zero. In this case, a leading end of the concave portion at a section through adjacent top portions and a bottom portion located between the adjacent top portions is sharp. Even in this case, it does not change the fact that the bottom portion of the concave and convex is present. In this case, the voids are formed over the entire surface between the substrate and the semiconductor layer. Further, the width L1 of the top portion T1 of the substrate 110 may be zero. At this time, the top portion T1 has a shape whose leading end is sharp.

5-3. Thickness and Type of Buffer Layer

The thickness of the buffer layer may be in a range of 5 nm or more but 20 nm or less. Further, as the material of the buffer layer, AlN may be used. The reason is that the wet etching is easier to progress.

6. Summary of Present Embodiment

As has been described above in detail, the light emitting element 100 of the present embodiment includes the clearance C over the first region R1 and the third region R3 and also includes a number of voids V in the second region R2. The clearance C is formed between the substrate 110 and the semiconductor layer 120. For this reason, in the first region R1 and the third region R3, most of the light that is directed toward the clearance C from the semiconductor layer 120 is totally reflected at the boundary between the clearance C and the semiconductor layer 120. Accordingly, the amount of light to be extracted is greater.

Meanwhile, the present embodiment is merely illustrative. Accordingly, it is natural that the present embodiment can be variously modified and changed without departing from the scope of the present invention. For example, the metal-organic chemical vapor deposition (MOCVD) is used to form the semiconductor layer 120. However, the vapor deposition such as the hydride vapor phase epitaxy (HVPE), the molecular beam epitaxy (MBE) or other methods may be used.

(Second Embodiment)

1. Semiconductor Light Emitting Element

Figure 7:
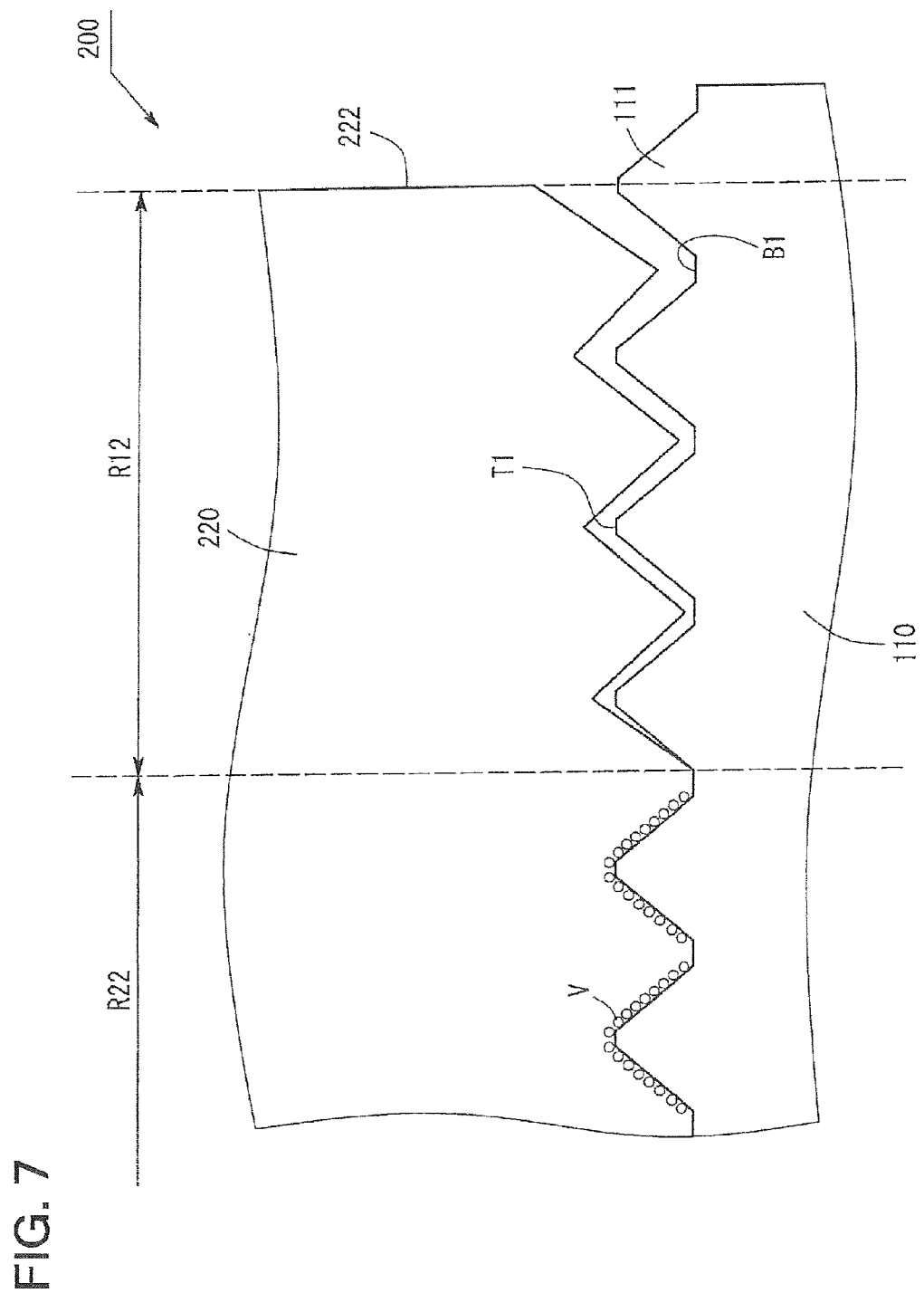
FIG. 7 is a view showing a first region and second region of a group-III nitride compound semiconductor light emitting element according to a second embodiment.

A second embodiment is described. A light emitting element 200 of the present embodiment is shown in FIG. 7. As shown in FIG. 7, the light emitting element 200 includes a first region R12 and a second region R22. However, the third region as described in the first embodiment is not present. Further, as shown in FIG. 7, the first region R12 and the second region R22 are positioned in order from an end surface 222 of the semiconductor layer 220.

Even in the case of the light emitting element 200 without the third region, the light is sufficiently reflected at a boundary surface between the semiconductor layer 220 and an air layer. For this reason, the light emitting efficiency of the light emitting element 200 is good. That is, the light emitting element 200 of the second embodiment can exhibit the same effects as the light emitting element 100 of the first embodiment.

2. Manufacturing Method for Semiconductor Light Emitting Element

By shortening the implementation time to carry out the wet etching in a wet etching process, it is possible to manufacture the light emitting element 200 without the third region. Further, the light emitting element 200 may be manufactured by applying other etching conditions such as the thickness of the buffer layer or the etching solution.

(Third Embodiment)

1. Semiconductor Light Emitting Element

Figure 8:
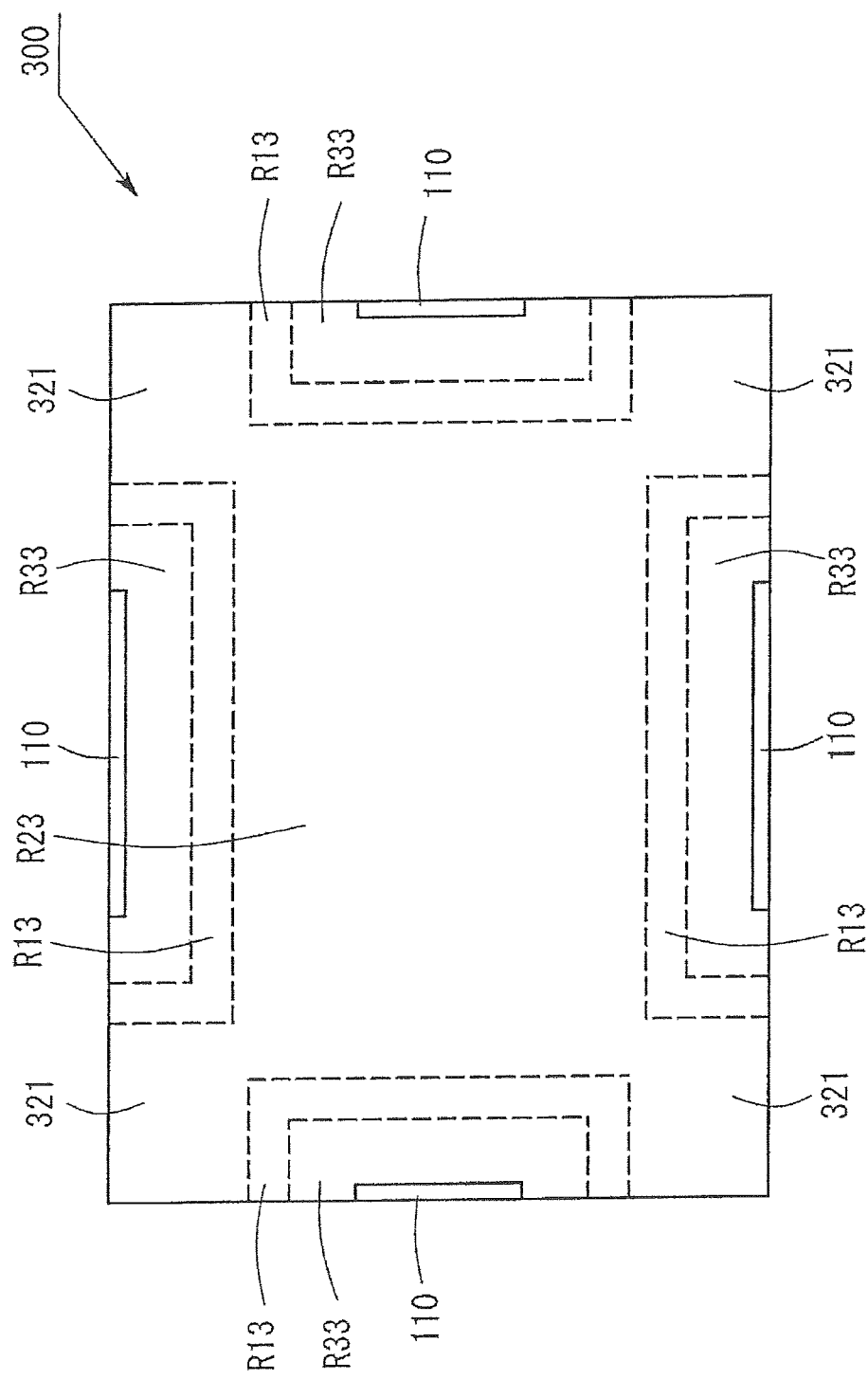
FIG. 8 is a view showing each region of a group-III nitride compound semiconductor light emitting element according to a third embodiment.

A third embodiment is described. A light emitting element 300 of the present embodiment is shown in FIG. 8. As shown in FIG. 8, the light emitting element 300 includes a first region R13, a second region R23 and a third region R33.

The light emitting element 300 includes corner portions 321 on the corner of the four sides of a semiconductor layer 320. In the corner portions 321, the semiconductor layer 320 is not subjected to etching by the wet etching. That is, the clearance C is not present in the corner portions 321. Further, the clearance C is formed on an outer periphery of the semiconductor layer 320 other than the corner portions 321. For this reason, damage is less likely to occur at the corner portions 321. That is, the strength of the light emitting element 300 is greater than that of the light emitting element 100 of the first embodiment.

2. Manufacturing Method for Semiconductor Light Emitting Element

In the present embodiment, the corner portions 321 are not etched by the wet etching. For this reason, in previous dry etching process, it may be desirable that surroundings forming the corner portions 321 are not removed by dry etching. That is, the corner portions 321 are not exposed. Thereby, the etching solution does not enter the corner portions. Accordingly, the corner portions 321 are not subjected to the wet etching but remain. By performing the element separation in this state, the light emitting element 300 in which the clearance C is not formed at the corner portions 321 is obtained.

(Fourth Embodiment)

1. Semiconductor Light Emitting Element

Figure 9:
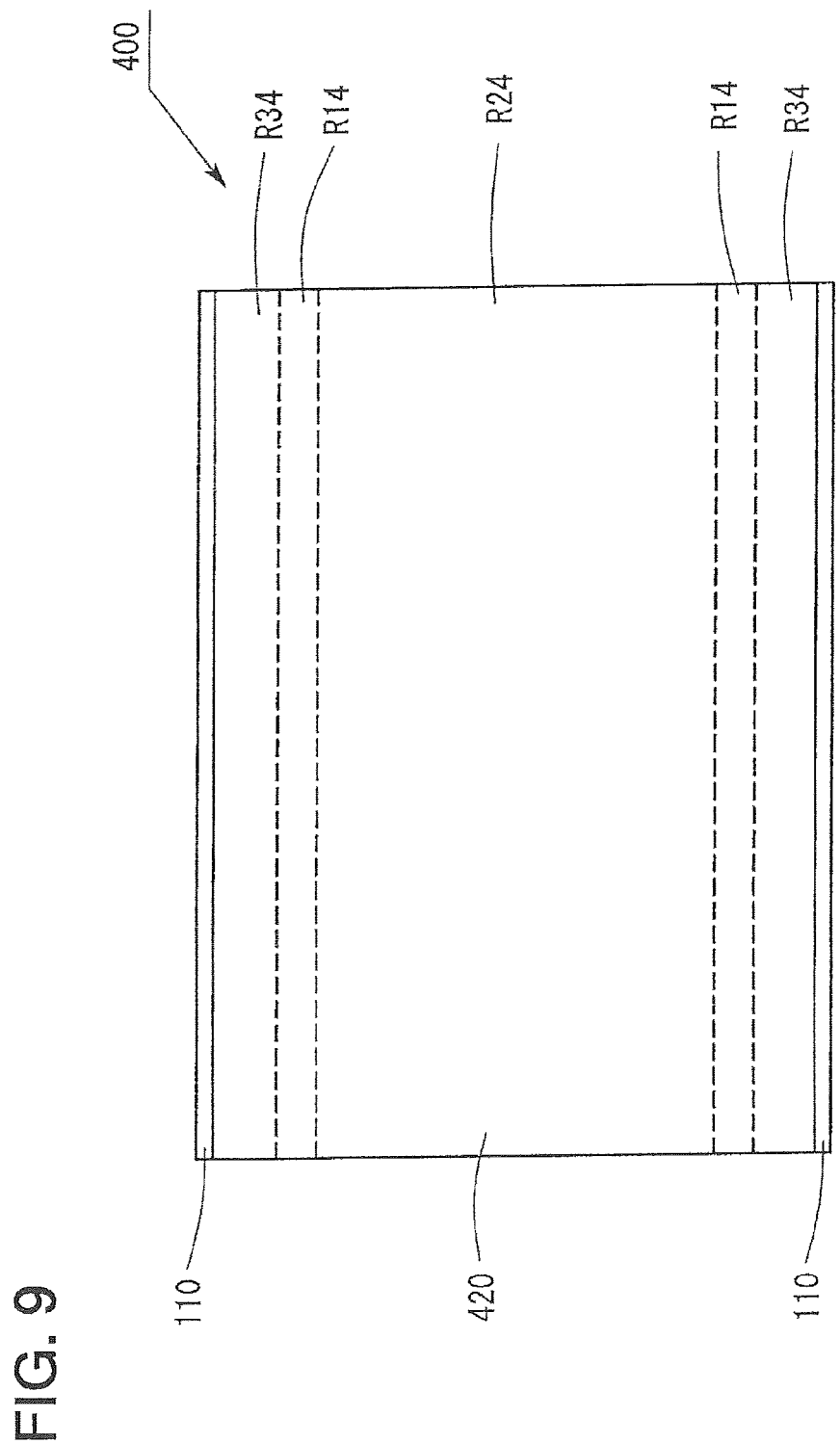
FIG. 9 is a view showing each region of a group-III nitride compound semiconductor light emitting element according to a fourth embodiment.

A fourth embodiment is described. A light emitting element 400 of the present embodiment is shown in FIG. 9. As shown in FIG. 9, the light emitting element 400 includes a first region R14, a second region R24 and a third region R34.

In the light emitting element 400, the clearance C is formed only at two opposing sides of a semiconductor layer 420, rather than four sides thereof, by the wet etching. Accordingly, the clearance is not formed at the remaining two sides.

2. Manufacturing Method for Semiconductor Light Emitting Element

Similar to the third embodiment, it may be desirable that the places of two sides forming the clearance are exposed and the places of two sides not forming the clearance are not exposed, in the dry etching process.

3. Modification

Although the clearance is formed at the places of two opposing sides of the semiconductor layer 420 the present embodiment, the clearance may be formed at adjacent two sides. Further, the clearance may be formed only at one side. Of course, the clearance may be formed at three sides.

(Fifth Embodiment)

1. Semiconductor Light Emitting Element

Figure 10:
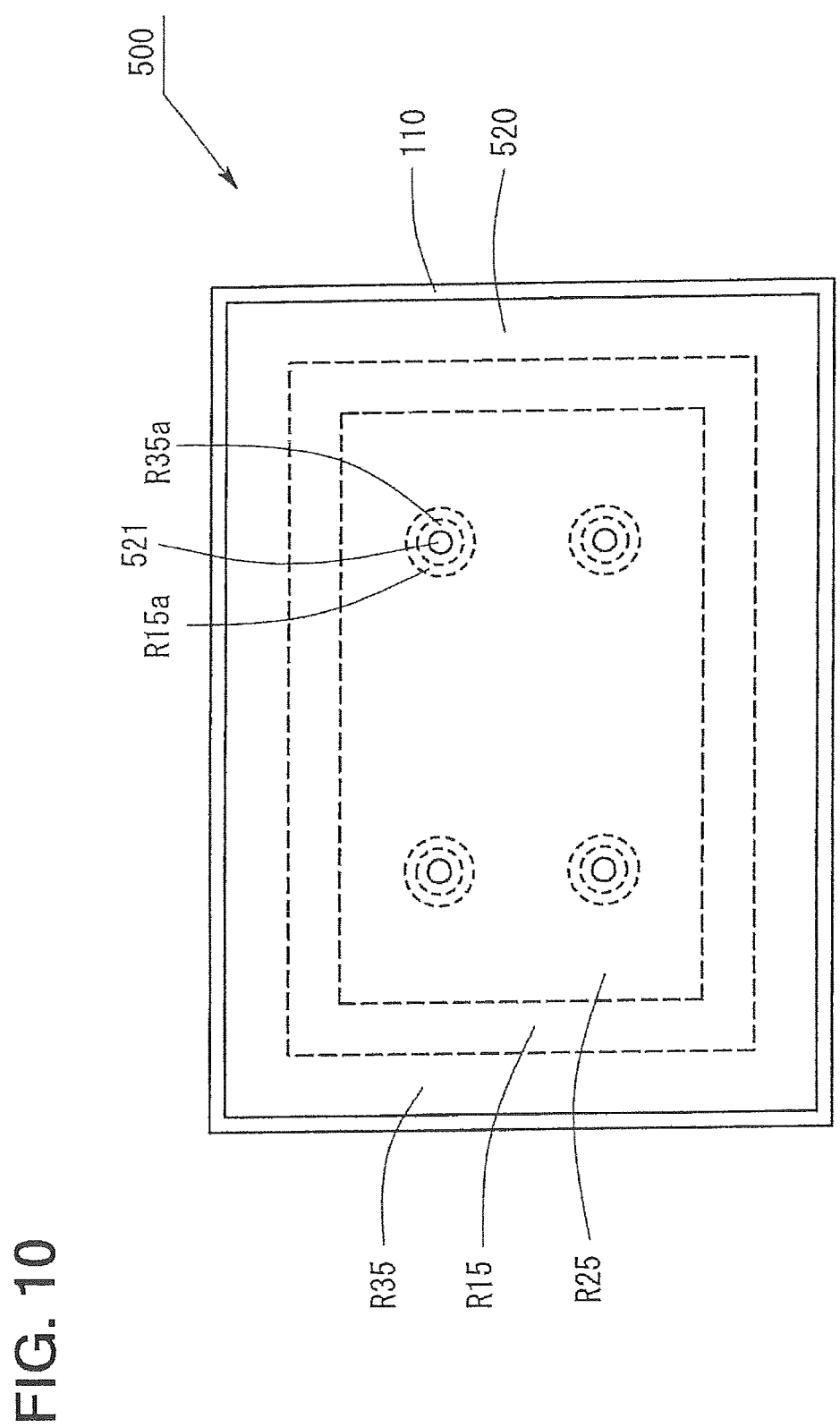
FIG. 10 is a view showing each region of a group-III nitride compound semiconductor light emitting element according to a fifth embodiment.

A fifth embodiment is described. A light emitting element 500 of the present embodiment is shown in FIG. 10. As shown in FIG. 10, the light emitting element 500 includes a first region R15, a second region R25 and a third region R35. Further, the light emitting element 500 includes a first region R15a and a third region R35a.

In the light emitting element 500, a hole 521 is formed on a semiconductor layer 520. The hole 521 penetrates the semiconductor layer 520. The main surface of the substrate 110 is exposed at the bottom of the hole 521. In FIG. 10, four holes 521 are formed. However, it is sufficient that one or more holes are formed. Of course, a number of holes may be formed. The hole 521 may be filled with a transparent insulator. The third region R35a, the first region R15a and the second region R25 are positioned in order from an inside surface of the hole 521.

2. Manufacturing Method for Semiconductor Light Emitting Element

The hole 521 may be formed in the dry etching process. Then, by performing a wet etching process, the clearance can be formed between the substrate 110 and the semiconductor layer 520 in the surroundings of the hole 521. Of course, the first regions R15, R15a and the third regions R35, R35a can be formed in the same process.

(Sixth Embodiment)

1. Semiconductor Light Emitting Element

Figure 11:
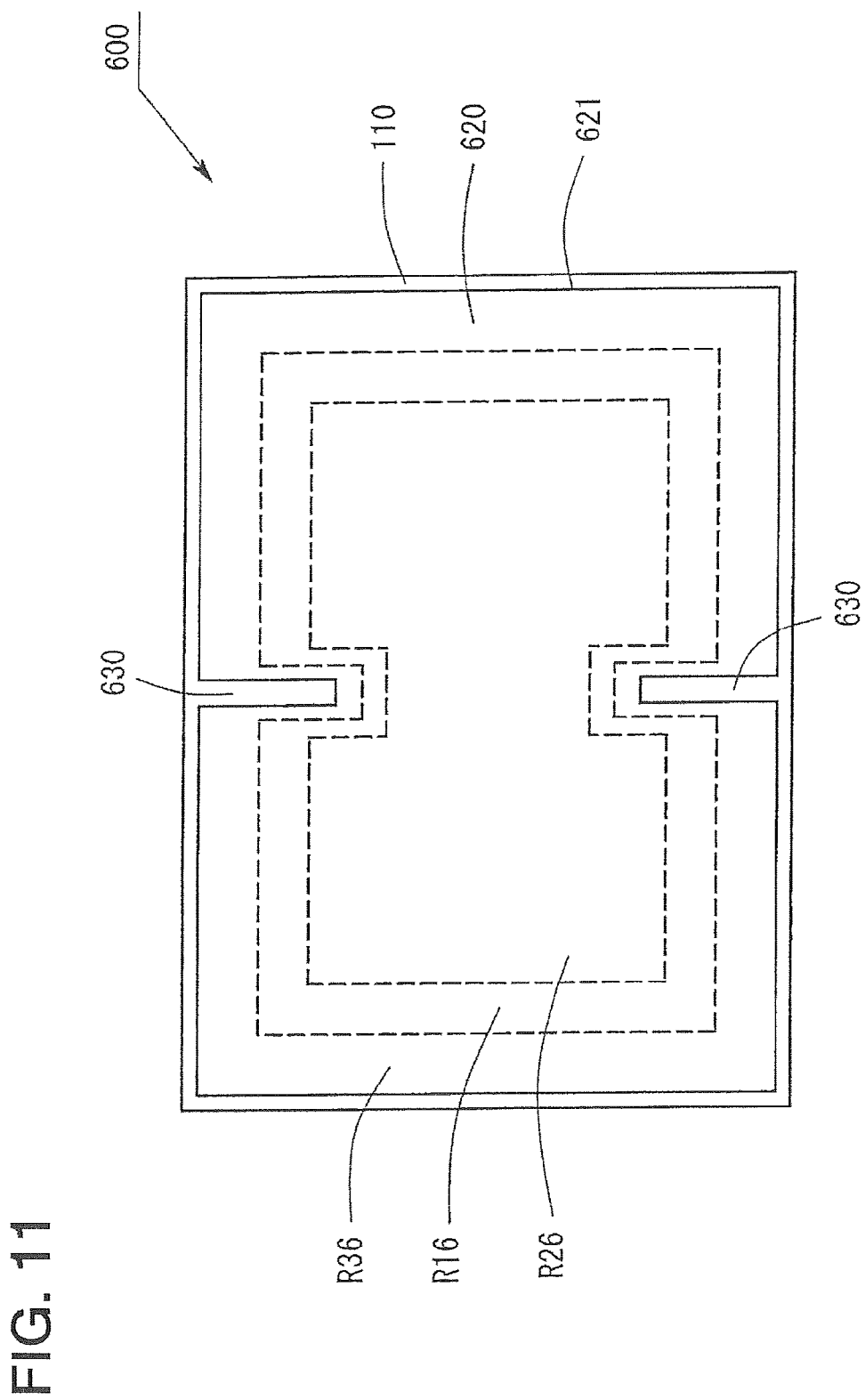
FIG. 11 is a view showing each region of a group-III nitride compound semiconductor light emitting element according to a sixth embodiment.

A sixth embodiment is described. A light emitting element 600 of the present embodiment is shown in FIG. 11. As shown in FIG. 11, the light emitting element 600 includes a first region R16, a second region R26 and a third region R36.

A slit 630 is formed on a semiconductor layer 620 of the light emitting element 600. The slit 630 is formed in a direction inward from an end surface 621 of the semiconductor layer 620. For this reason, the contact area of the semiconductor layer in contact with etching solution is large when a wet etching is carried out. That is, the etching solution is easy to enter. Further, the area occupied by the first region R16 is wider than the area occupied by the first region R1 in the first embodiment. Accordingly, the light tends to be more reflective at a boundary surface between the substrate 110 and the semiconductor layer 620. In this case, it is assumed that the etching condition such as the etching time is constant.

2. Manufacturing Method for Semiconductor Light Emitting Element

The slit 630 is formed in a dry etching process. Then, by performing a wet etching, the light emitting element 600 can be manufactured.

(Seventh Embodiment)

1. Semiconductor Light Emitting Device

Figure 12:
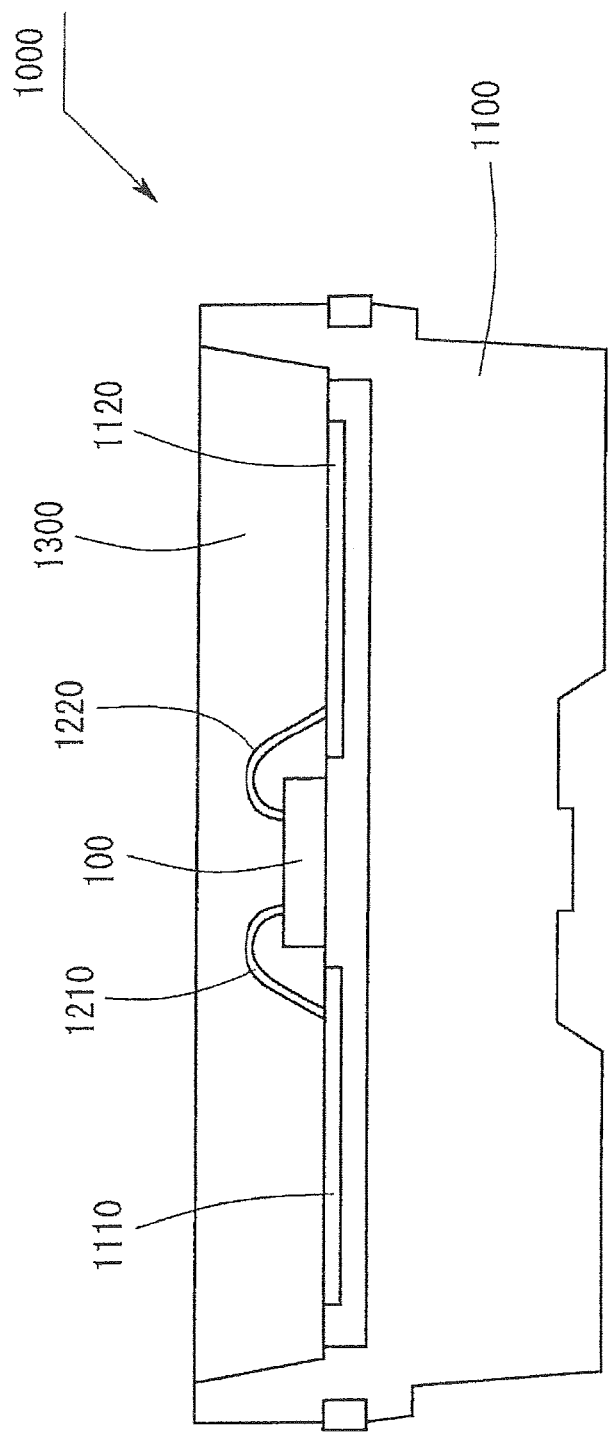
FIG. 12 is a view showing a configuration of a semiconductor light emitting device according to a seventh embodiment.

A seven embodiment is described. A light emitting device 1000 is a semiconductor light emitting device including the light emitting element 100 as described in the first embodiment to the sixth embodiment. An example of the light emitting device 1000 of the present embodiment is shown in FIG. 12.

The light emitting device 1000 includes the light emitting element 100, a case 1100, lead frames 1110, 1120, bonding wires 1210, 1220 and a sealing resin 1300. The p-pad electrode P1 of the light emitting element 100 is electrically connected to the lead frame 1110 via the bonding wire 1210. The n-pad electrode N1 of the light emitting element 100 is electrically connected to the lead frame 1120 via the bonding wire 1220.

The case 1100 is formed with a concave portion. The light emitting element 100 is disposed inside the concave portion. The concave portion is filled with the sealing resin 1300. Further, the clearance C of the light emitting element 100 is also filled with the sealing resin 1300.

In a case where the material of the substrate 110 is sapphire, the refractive index thereof is 1.77. The refractive index of GaN is about 2.4. The refractive index of air is 1. The refractive index of the sealing resin is about 1.5. Of course, these values depend on the material but are not significantly changed. In this way, the refractive index at a boundary surface between the semiconductor layer and the sealing resin 1300 is different. Accordingly, it does not change the fact that the light is reflected.

Although the light emitting device includes the light emitting element 100 of the first embodiment in FIG. 12, it is natural that the light emitting device may include other light emitting elements 200, 300, 400, 500, 600 described so far.

Further, the light emitting device can be applied to a light emitting device in which a gap between a chip and a side wall of a package is narrow, as in a side-view package. The reason is that the light extracted from the chip is extracted to the outside of the light emitting device without hitting the side wall of the package. That is, the light emitting device is brighter.

Hereinabove, the first embodiment to the seventh embodiment have been described. These embodiments and each modification thereof may be properly combined.

EXAMPLE

1. Experiment 1

Now, Experiment is described. Experiment 1 was performed for comparing the brightness of the semiconductor light emitting elements according to the present/absence of the clearance. In the semiconductor light emitting element according to Example, the clearance was formed by forming voids and then performing an etching. The semiconductor light emitting element according to Example corresponds to the light emitting element 100 of the first embodiment out of the above-described embodiments. In a semiconductor light emitting element according to Comparative Example, voids were not formed and thus the clearance was not present. Accordingly, the semiconductor light emitting element of Example and the semiconductor light emitting element according to Comparative Example are the same, except for the above difference.

In both Example and Comparative Example, the shape of the substrate was the same. Specifically, the width L1 of the top portion T1 is 0.3 μm, the width L2 of the bottom portion is 3 μm, the width L3 of the bottom surface B1 is 0.5 μm, the pitch L4 of the top portion T1 is 3.5 μm, the depth D1 of the concave and convex portion 111 is 1.6 μm and the angle θ1 of the slant surface S1 to the bottom surface B1 is 50°.

Further, in both Example and Comparative Example, the same semiconductor layer was formed. However, Example is different from Comparative Example in that the clearance is formed at a boundary surface to the substrate by a wet etching. A buffer layer, an n-type contact layer, an n-type ESD layer, an n-type SL layer, a light emitting layer, a p-type cladding layer and a p-type contact layer were formed in order on the main surface of the substrate 110. Then, ITO was formed on the p-type contact layer and a p-pad electrode was formed on the ITO. Further, a portion of the n-type contact layer was exposed, thereby forming an n-pad electrode.

As the n-type contact layer, an n-type GaN layer was formed. The n-type ESD layer was configured as a structure that is obtained by repeatedly laminating GaN and n-type GaN five times. The n-type SL layer was configured as a structure that is obtained by repeatedly laminating InGaN, GaN and n-type GaN in order from the substrate side five times. The light emitting layer was configured as a structure that is obtained by repeatedly laminating InGaN and AlGaN five times. As the p-type cladding layer, a p-type AlGaN layer was formed. As the p-type contact layer, a p-type GaN layer was formed.

Here, AlN was formed as the buffer layer. Further, phosphoric acid etching solution containing the components shown in Table 1 was used as the etching solution. Temperature of the etching solution was 140° C. The immersion time of the semiconductor light emitting element of Example in the etching solution was fifteen minutes. A lateral etching distance was about 20 μm. Accordingly, the etching rate is about 1.3 μm/min.

TABLE 1

| Component | Concentration |
|---|---|
| Phosphoric Acid | 86% |
| Water | 14% |

Figure 13:
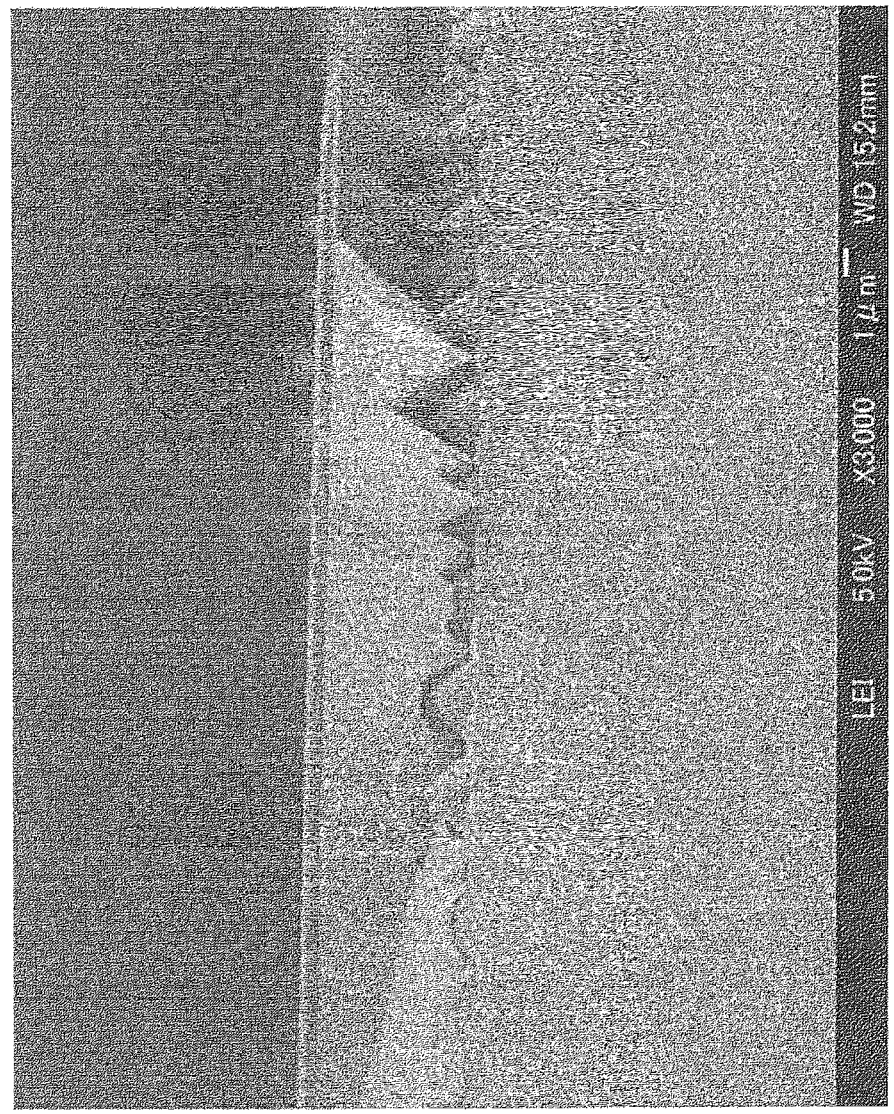
FIG. 13 is a photomicrograph showing a clearance of a group-III nitride compound semiconductor light emitting element according to the embodiments.

FIG. 13 is a photomicrograph (SEM photograph) showing a clearance in Example. The photomicrograph shows that the clearance is formed by the wet etching.

Total radiation flux in the semiconductor light emitting element of Example and Comparative Example is shown in Table 2. Radiation intensity in the semiconductor light emitting element of Example was 6.28 mW/Sr and radiation intensity in the semiconductor light emitting element of Comparative Example was 5.77 mW/Sr.

TABLE 2

| | Clearance | Radiation Intensity |
|---|---|---|
| Example | Present | 6.28 mW/Sr |
| Comparative Example | Absent | 5.77 mW/Sr |

As described above, the semiconductor light emitting element of Example including the clearance C is bright, as compared with the semiconductor light emitting element of Comparative Example.

2. Experiment 2

Now, Experiment 2 is described. Experiment 1 has evaluated the ease of progression of the etching. For this purpose, the semiconductor layer was formed in such a way that a substrate without concave and convex is used and therefore voids are not formed. Since there are no concave and convex, the etching solution is difficult to enter between the substrate and the semiconductor layer from the side surface of the substrate. For this reason, it is considered that the etching is difficult to be carried out. Further, since there are no voids, the etching is difficult to progress. In this way, the wet etching was performed in a condition where the etching is difficult to progress.

Experiment 2 used a laminate (hereinafter, referred to as "AlN buffer laminate") that is obtained by forming AlN as a buffer layer and growing a nitride semiconductor on the AlN and a laminate (hereinafter, referred to as "GaN buffer laminate") that is obtained by forming GaN as a buffer layer and growing a nitride semiconductor on the GaN.

Figure 14:
FIG. 14 is a photomicrograph showing experimental results confirming the etching property to the phosphoric acid in a buffer layer made of AlN.

FIG. 14 shows a photomicrograph (SEM photograph) in a case where the AlN buffer laminate was subjected to a wet etching. As shown in FIG. 14, the etching was progressed by the wet etching, even in a case where the semiconductor layer was grown in such a way that a substrate without concave and convex is used and therefore voids are not formed. Those shown in Table 1 were used as the etching solution. The immersion time was twenty-five minutes. The lateral etching distance was about 3 μm. Accordingly, the etching rate is about 0.12 μm/min. This etching rate is an etching rate associated with the AlN buffer laminate. In a case where the etching is performed on a semiconductor element in which the voids are formed on a substrate having concave and convex (as described in above-described each embodiment), etching rate is assumed to be larger than the above etching rate.

Meanwhile, when the GaN buffer laminate is subjected to the wet etching under the same conditions as the above-described AlN buffer laminate, the depth of the etching was sufficiently small, as compared to the case of the AlN buffer laminate.

As such, the wet etching in the case of using the AlN buffer laminate is easier to progress, as compared to the case of using the GaN buffer laminate. In Experiment 2, the semiconductor layer was formed in such a way that a substrate without concave and convex is used and therefore voids are not formed. In a case where a substrate having concave and convex is used and therefore voids are formed, it is considered that etching rate is higher. Further, even in this case, it does not change the fact that the wet etching in a case of using the AlN as the buffer layer is easier to progress.

What is claimed is:

1. A group-III nitride compound semiconductor light emitting element comprising:
   a substrate that has a main face on which a concave and convex portion is formed;
   a group-III nitride compound semiconductor layer that is formed on the main face of the substrate; and
   a clearance that is formed between the substrate and the group-III nitride compound semiconductor layer at a first region of the semiconductor light emitting element,
   wherein, in the first region, a portion of the group-III nitride compound semiconductor layer and a portion of the clearance are disposed in a concave of the concave and convex portion on a section through two adjacent top portions of the concave and convex portion and a bottom portion located between the adjacent top portions,
   wherein, in the first region, the group-III nitride compound semiconductor layer includes a concave portion that is concave away from the substrate,
   wherein an apex of a convex of the concave and convex portion is centrally aligned with a vertex of the concave portion of the group-III nitride compound semiconductor layer, and
   wherein the apex of the convex of the concave and convex portion of the substrate is shifted in a direction perpendicular to a stacking direction of the substrate and the semiconductor layer from a positon where the apex of the convex of the concave and convex portion is aligned with an apex of the group-III nitride compound semiconductor layer in the stacking direction.

2. The group-III nitride compound semiconductor light emitting element according to claim 1, wherein, in the first region, the group-III nitride compound semiconductor layer includes a convex portion that is convex toward the substrate, and
   the convex portion is disposed at a position facing to a bottom portion of a concave of the concave and convex portion.

3. The group-III nitride compound semiconductor light emitting element according to claim 2,
   wherein a vertex of the convex portion of the group-III nitride compound semiconductor layer is disposed in the concave of the concave and convex portion on the section through the two adjacent top portions of the concave and convex portion and the bottom portion located between the adjacent top portions.

4. The group-III nitride compound semiconductor light emitting element according to claim 1, further comprising voids that are formed in at least a portion between the substrate and the group-III nitride compound semiconductor layer at a second region of the semiconductor light emitting element.

5. The group-III nitride compound semiconductor light emitting element according to claim 4,
   wherein the clearance is formed between the substrate and the group-III nitride compound semiconductor layer at a third region of the semiconductor light emitting element, and
   in the third region, a portion of the clearance is disposed in the concave of the concave and convex portion on the section through the two adjacent top portions of the concave and convex portion and the bottom portion located between the adjacent top portions.

6. The group-III nitride compound semiconductor light emitting element according to claim 5, wherein the first region is disposed between the second region and the third region.

7. The group-III nitride compound semiconductor light emitting element according to claim 1,
   wherein the group-III nitride compound semiconductor layer includes a buffer layer at a position facing the substrate, the buffer layer having an concave and convex shape along the concave and convex portion, and the buffer layer includes AlN.

8. A semiconductor light emitting device comprising:
   the group-III nitride compound semiconductor light emitting element described in claim 1;
   a case that accommodates the group-III nitride compound semiconductor light emitting element in a concave portion of the case; and
   a sealing resin that fills the concave portion.

9. The semiconductor light emitting device according to claim 8, wherein the sealing resin fills the clearance.

10. The group-III nitride compound semiconductor light emitting element according to claim 4, a boundary between the first region and the second region is in a range of 5 µm or more but 50 µm or less from an end of the semiconductor layer.

11. The group-III nitride compound semiconductor light emitting element according to claim 1, wherein the clearance at a given position becomes wider as the given position is closer to an outer edge of the substrate.

12. The group-III nitride compound semiconductor light emitting element according to claim 1, wherein a width of the clearance continuously increases from an inner end of the first region to an end of the semiconductor layer, the inner end being the closest portion of the first region to a center of the substrate.

13. The group-III nitride compound semiconductor light emitting element according to claim 1, wherein a center of the apex of the convex of the concave and convex portion and the vertex of the concave portion of the group-III nitride compound semiconductor layer are aligned with each other in a direction parallel to a stacking direction of the substrate and the group-III nitride compound semiconductor layer.

14. The group-III nitride compound semiconductor light emitting element according to claim 1, wherein the apex of the group-III nitride compound semiconductor layer includes a sharp end.

15. A group-HI nitride compound semiconductor light emitting element comprising:
   a substrate that has a main face on which an concave and convex portion is formed;
   a group-III nitride compound semiconductor layer that is formed on the main face of the substrate; and a clearance that is formed between the substrate and the group-III nitride compound semiconductor layer at a first region of the semiconductor light emitting element, wherein, in the first region, a portion of the group-III nitride compound semiconductor layer and a portion of the clearance are disposed in a concave of the concave and convex portion on a section through two adjacent top portions of the concave and convex portion and a bottom portion located between the adjacent top portions, wherein the concave and convex portion of the substrate includes a slant surface that is in a range of 40° or more but 80° or less to the main surface of the substrate, and wherein an apex of a convex of the concave and convex portion of the substrate is shifted in a direction perpendicular to a stacking direction of the substrate and the semiconductor layer from a positon where the apex of the convex of the concave and convex portion is centrally aligned with an apex of the group-III nitride compound semiconductor layer in the stacking direction.

16. The group-III nitride compound semiconductor light emitting element according to claim 15, wherein the apex of the group-III nitride compound semiconductor layer includes a sharp end.

* * * * *